United States Patent
Chou et al.

(10) Patent No.: US 7,545,222 B2
(45) Date of Patent: Jun. 9, 2009

(54) PHASE LOCK LOOP FOR RAPID LOCK-IN AND METHOD THEREFOR

(75) Inventors: Yu-Pin Chou, Miao-Li Hsien (TW); Chi-Kung Kuan, Tao-Yuan Hsien (TW)

(73) Assignee: Realtek Semiconductor Corp., Hsinchu (TW)

(*) Notice: Subject to any disclaimer, the term of this patent is extended or adjusted under 35 U.S.C. 154(b) by 107 days.

(21) Appl. No.: 11/620,053

(22) Filed: Jan. 5, 2007

(65) Prior Publication Data

US 2007/0159263 A1 Jul. 12, 2007

(30) Foreign Application Priority Data

Jan. 6, 2006 (TW) .............. 95100670 A

(51) Int. Cl.
*H03L 7/00* (2006.01)
(52) U.S. Cl. ............ 331/1 A; 331/17; 331/DIG. 2
(58) Field of Classification Search ............ 331/1 A, 331/16, 17, 25, DIG. 2; 327/156–159; 375/376
See application file for complete search history.

(56) References Cited

U.S. PATENT DOCUMENTS

| 4,686,560 | A | | 8/1987 | Balaban et al. | |
|---|---|---|---|---|---|
| 4,715,000 | A | | 12/1987 | Premerlani | |
| 5,337,335 | A | * | 8/1994 | Cloetens et al. | 375/376 |
| 5,656,975 | A | | 8/1997 | Imura | |
| 5,727,038 | A | * | 3/1998 | May et al. | 375/376 |
| 6,222,400 | B1 | | 4/2001 | Fukuda et al. | |
| 6,473,478 | B1 | | 10/2002 | Wallberg et al. | |
| 7,132,897 | B2 | | 11/2006 | Hofmann | |
| 7,245,687 | B2 | | 7/2007 | Chang | |
| 7,382,163 | B2 | | 6/2008 | Kuo et al. | |
| 2003/0048139 | A1 | | 3/2003 | Chien | |

FOREIGN PATENT DOCUMENTS

| CN | 1387321 | 12/2002 |
|---|---|---|
| DE | 103 54 522 A1 | 6/2005 |
| DE | 10 2004 006 996 A1 | 9/2005 |
| EP | 0 471 502 A1 | 2/1992 |
| TW | 234933 | 6/2005 |
| WO | WO2005/078935 A1 | 8/2005 |

OTHER PUBLICATIONS

English language translation of abstract of TW 234933 (p. 3 of reference).
English language translation of abstract of CN 1387321.

* cited by examiner

*Primary Examiner*—Joseph Chang
(74) *Attorney, Agent, or Firm*—Thomas, Kayden, Horstemeyer & Risley

(57) ABSTRACT

A phase-locked loop (PLL) for rapid lock-in applicable to digital, analog, or hybrid digital-analog PLL circuits is provided. Besides the units for basic operation, including a phase-frequency detector (PFD), a charge pump, a loop filter, and/or a voltage/current/digital-controlled oscillator (VCO/ICO/DCO), an additional lock-in actuator circuit is provided for providing lock-in signals, achieving the purpose of rapid lock-in through operational processes.

16 Claims, 8 Drawing Sheets

PHASE LOCK LOOP FOR RAPID LOCK-IN AND METHOD THEREFOR

BACKGROUND OF THE INVENTION

1. Field of Invention

The present invention relates to a phase-locked loop (PLL), and more particularly to a PLL capable of rapid lock-in.

2. Related Art

A PLL is an automatic control circuit system capable of tracing the frequency and phase of an input signal, which mainly traces and locks the phase and frequency of an output signal and an input signal such that the phase and frequency of the output signal and the input signal tend to be the same, and at this moment, they are referred to as being locked.

PLLs may be generally classified into analog PLLs and digital PLLs. Taking the system architecture of a common digital PLL as an example, referring to FIG. 1, it is a system block diagram of a conventional digital PLL. As shown in FIG. 1, the digital PLL 10 includes a phase-frequency detector (PFD) 100, a phase difference quantizer 110, and a digital controlled oscillator (DCO) 120, and a divider 130 is further added if different multiple frequencies are required. Since the basic concept of the conventional analog PLL is similar to that of the digital PLL and is well known by those skilled in the art, it will not be described herein.

Referring to FIG. 2, it is a corresponding diagram of frequency to period of the reference signal, wherein the horizontal axis represents time, and the vertical axis represents frequency. During rising time of a square wave, a conventional analog PLL or a digital PLL will reach a lock-in state generally after generating a plurality of oscillation periods 201. For operating frequencies above MHz, a time period of several microseconds (μs) or even less is required to achieve a lock-in state, and also being closely related to the reference signal frequency. Even with greater bandwidth, the conventional PLL locks-in after oscillating scores or hundreds of periods. Therefore, even for some practical applications with low reference signal frequency such as video systems and display systems, the stability and operating speed of the PLL still do not meet their needs, which is a problem yet to be solved.

SUMMARY OF THE INVENTION

It is an object of the present invention to provide a PPL for rapid lock-in, and it is another object of the present invention to provide a method applicable to a PPL for rapid lock-in that a phase-locked output signal may directly be forced into the lock-in state.

In the present invention, where an analog, digital, or hybrid PLL is provided, a lock-in actuator circuit receives a reference signal and a phase-locked output signal, generates a lock-in signal accordingly, and outputs the lock-in signal to the loop filter or/and VCO/ICO/DCO.

In another aspect of the present invention, where a method applicable to the PLL for rapidly achieving a lock-in state is provided, includes first making a temporal feature measurement and then providing a lock-in signal according to the temporal feature.

The present invention achieves the object of rapidly entering into a lock-in state by using a lock-in actuator circuit. Features and practices related to the present invention will be illustrated in detail below with preferred embodiments with accompanying drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description

BRIEF DESCRIPTION OF THE DRAWINGS

The present invention will become more fully understood from the detailed description given herein below for illustration only, and which thus is not limitative of the present invention, and wherein:

FIG. 3 is a system block diagram of an analog PLL for rapid lock-in;

FIG. 7 is a system block diagram of a digital PLL for rapid lock-in; and

FIG. 8 is a system block diagram of a hybrid digital-analog PLL for rapid lock-in.

DETAILED DESCRIPTION OF THE INVENTION

Figure 3:
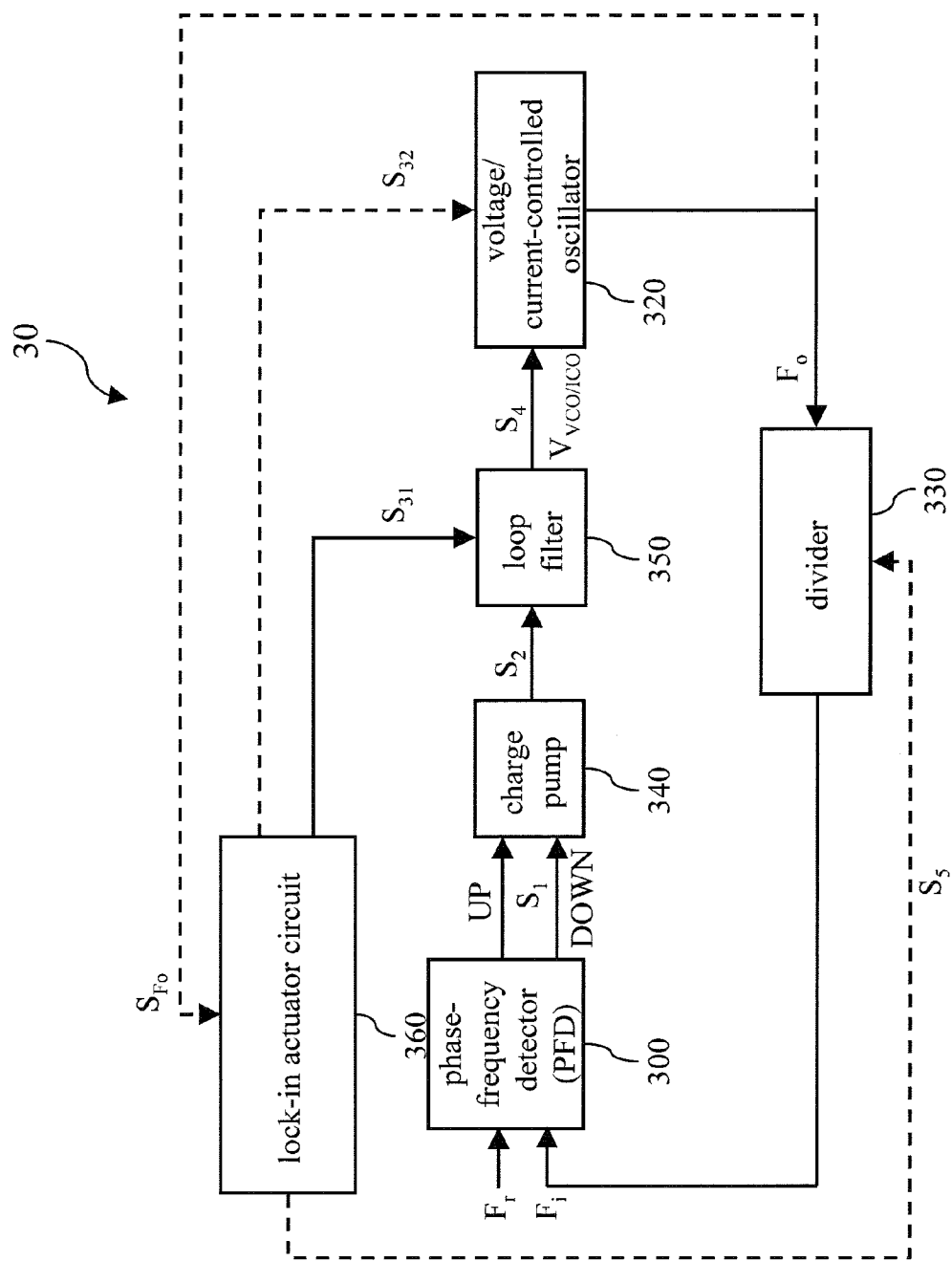

Please refer to FIG. 3, which is an embodiment of an analog PLL for rapid lock-in. As shown in FIG. 3, the analog PLL 30 includes a PFD 300, a VCO/ICO 320, a charge pump 340, a loop filter 350, a divider 330, and a lock-in actuator circuit 360.

The PFD 300 is used to compare a phase difference between a feedback signal $F_i$ and a reference signal $F_r$ and output a phase difference signal $S_1$ according to the phase/frequency of the input signals. Generally the phase difference signal $S_1$ may be classified as an UP signal or a DOWN signal whose signal value and time difference represent the magnitude of phase difference of the feedback signal $F_i$ and reference signal $F_r$. Representation is not limited to the UP signal and DOWN signal, but since the meanings of other representations are similar, they will not be described herein.

The charge pump 340 is used to output a signal $S_2$ according to the phase difference signal $S_1$, the signal $S_2$ corresponding to the phase difference between the feedback signal $F_i$ and reference signal $F_r$.

The loop filter 350 comprising capacitance elements and resistance elements is mainly used for filtering. It also receives a lock-in signal $S_{31}$ from the lock-in actuator circuit 360, and outputs a corresponding reference voltage signal $S_4$ according to the lock-in signal $S_{31}$ (and the signal $S_2$ if necessary). The VCO/ICO 320 outputs a corresponding phase-locked output signal $F_o$ according to the reference voltage signal $S_4$.

The divider 330 is used to divide the phase-locked output signal $F_o$ into the feedback signal $F_i$ according to a frequency division control signal $S_5$ generated from the lock-in actuator circuit 360, when a relationship of multiple frequency exists between frequencies of the phase-locked output signal $F_o$ and reference signal $F_r$. In some cases, when frequencies of the phase-locked output signal $F_o$ and the reference signal $F_r$ are meant to be the same, this divider 330 is a redundant element and may be omitted.

Since an intended voltage signal is directly given by using the operation to get a target operating frequency, the oscillations in the PLL system may be reduced, such that the lock-in state may be achieved rapidly.

The lock-in actuator circuit 360 is additionally added for feedback mechanisms. The phase-locked output signal $F_o$ generated by the VCO/ICO 320 returns to the lock-in actuator circuit 360 via the loop, i.e. signal $S_{Fo}$, and the lock-in signals $S_{31}$, $S_{32}$ will then be generated by the lock-in actuator circuit 360. The lock-in signal $S_{31}$ may generate the reference voltage signal $S_4$ corresponding to the lock-in signals through the loop filter 350. After the reference voltage signal $S_4$ inputs VCO/ICO 320, a corresponding phase-locked output signal $F_o$ is then generated. By performing appropriate circuit design modifications, the VCO/ICO 320 may also be controlled directly by using the lock-in signal $S_{32}$ to generate the corresponding phase-locked output signal $F_o$. The numerous modifications should be well known to those skilled in the art, and are thus omitted herein.

Figure 4:
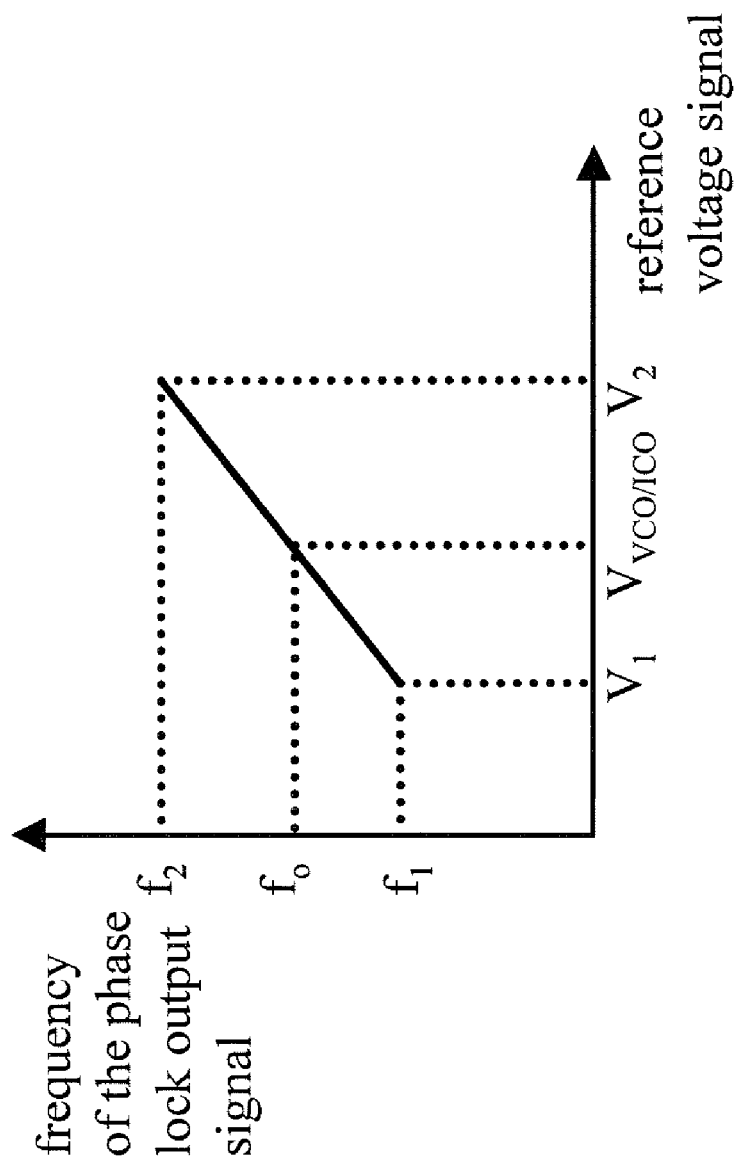
FIG. 4 is a diagram of frequencies of a reference voltage signal and a phase-locked output signal.

Please refer to FIG. 4, which is a corresponding diagram of frequencies of the reference voltage signal and the phase-locked output signal. In the drawing, there are two reference voltage signals $V_1$ and $V_2$ on the horizontal axis, which respectively correspond to frequencies $f_1$ and $f_2$ of the phase-locked output signal on the vertical axis, and a line may be obtained by linearly connecting intersection points $(V_1, f_1)$ and $(V_2, f_2)$. A desired operating frequency, that is, the frequency $f_o$ of the phase-locked output signal $F_o$, may be found by using interpolation or extrapolation, and the frequency $f_o$ of the phase-locked output signal corresponds to a voltage value, i.e. a desired target reference voltage signal ($V_{VCO/ICO}$) according to the linear relationship in the drawing. Thus, the phase-locked output signal $F_o$ of the operating frequency may be directly obtained after a reference voltage signal $V_{VCO/ICO}$ passes through the VCO/ICO 320. The interpolation or extrapolation used here will not be limited to linear ones, since according to individual circuit characteristics, using curvilinear interpolation/extrapolation, look-up tables, or even pre-calculations of provided parameters that include voltage, frequency, ... etc., should also fall within the scope of the present invention.

Figure 1:
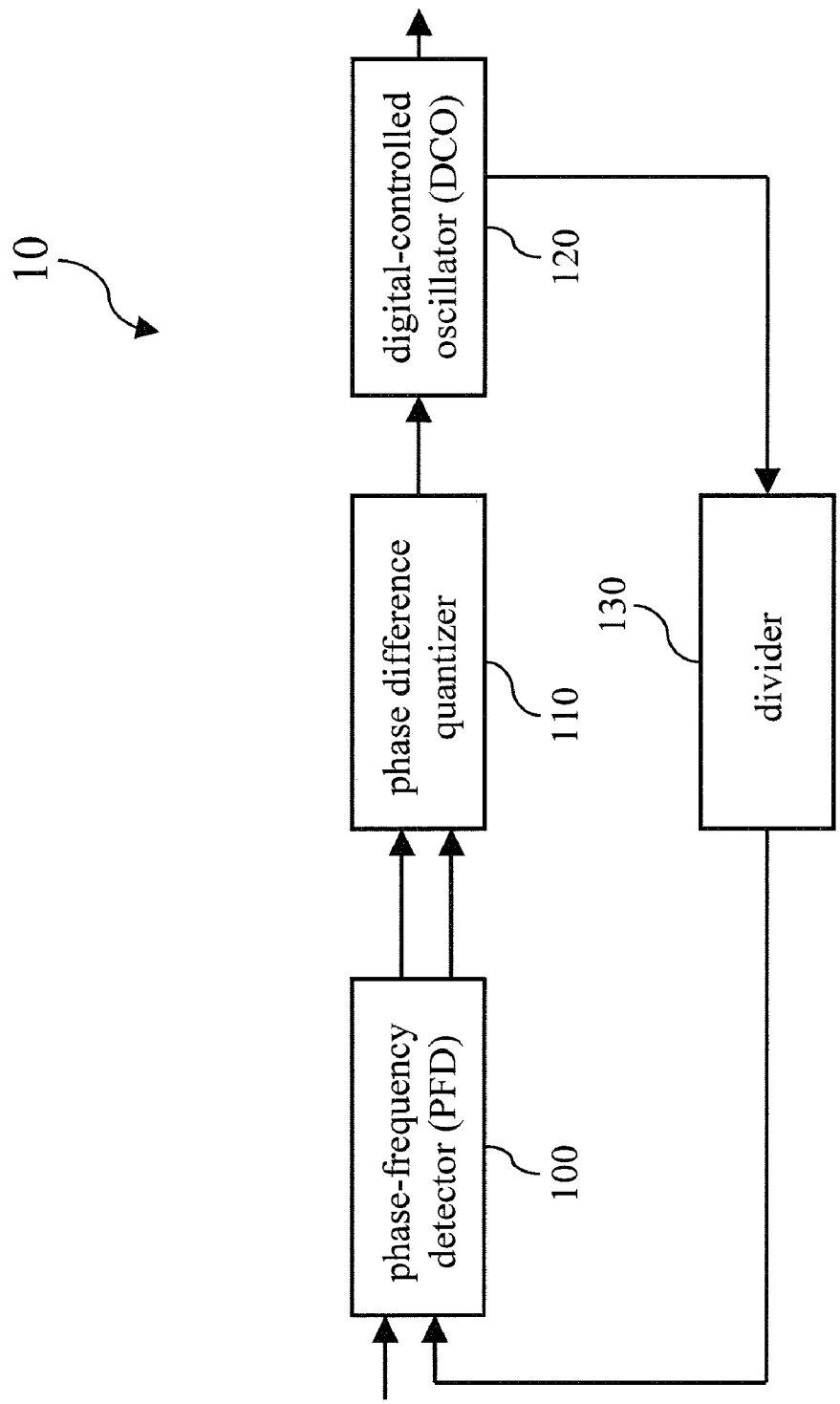
FIG. 1 is a system block diagram of a conventional digital PLL.
Figure 2:
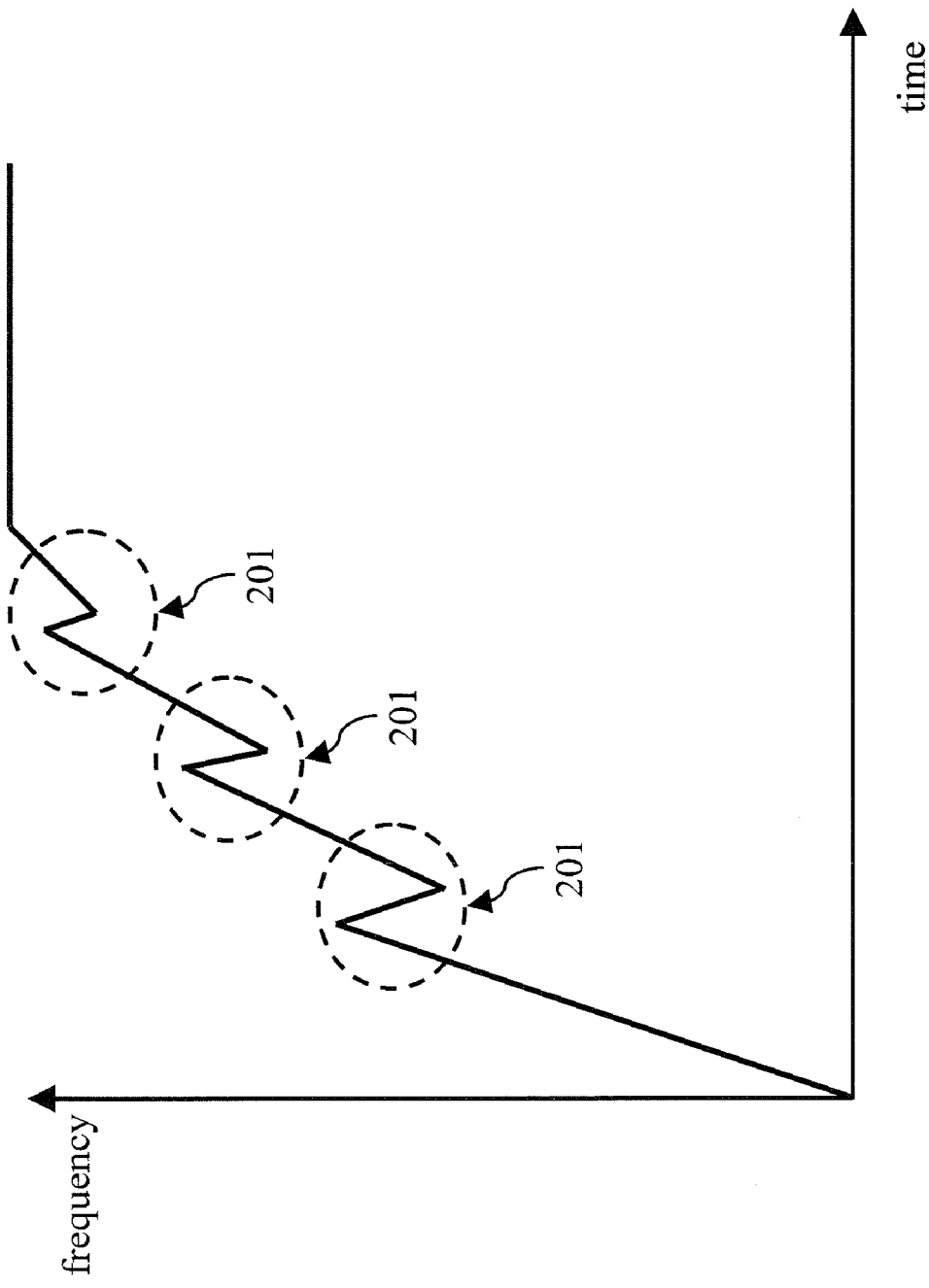
FIG. 2 is a diagram of frequency to period of the reference signal.
Figure 5:
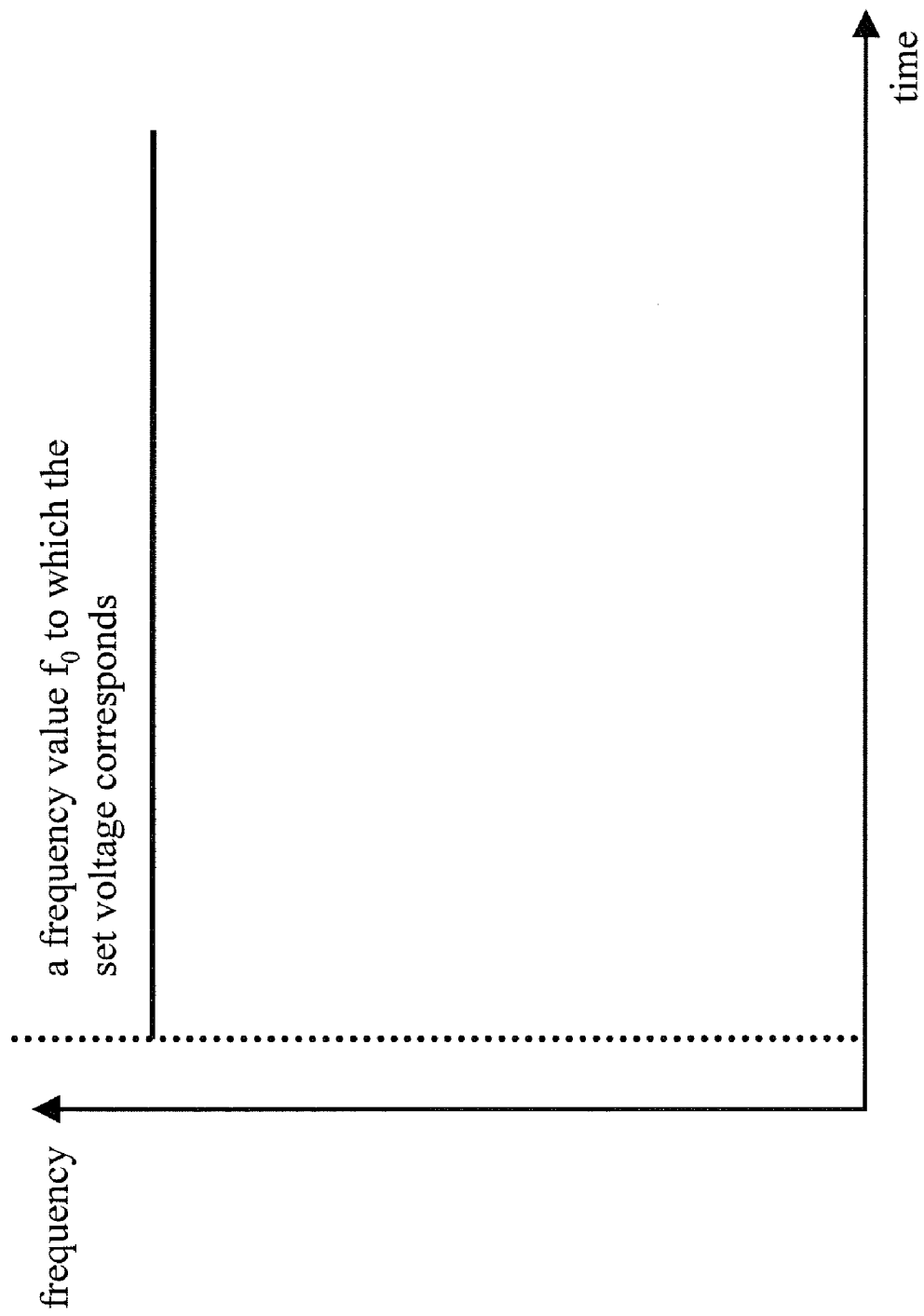
FIG. 5 is a diagram of frequency to period of the reference signal.

Since the rapid lock-in function provided by the present invention may perform an auto-calibration to adapt changes due to temperature and voltage shift during process, the system may be able to achieve the lock-in state without having to experience many oscillation periods. Please refer to FIG. 5, which is a corresponding diagram of frequency to period of a reference signal. In FIG. 5, the horizontal axis represents the time, and the vertical axis represents the frequency, and comparing with what is shown in FIG. 2, the rapid lock-in function of the present invention enters into the lock-in state immediately within an extremely short period of time, that is, to directly reach frequency $f_o$ to which the set voltage corresponds.

Figure 6:
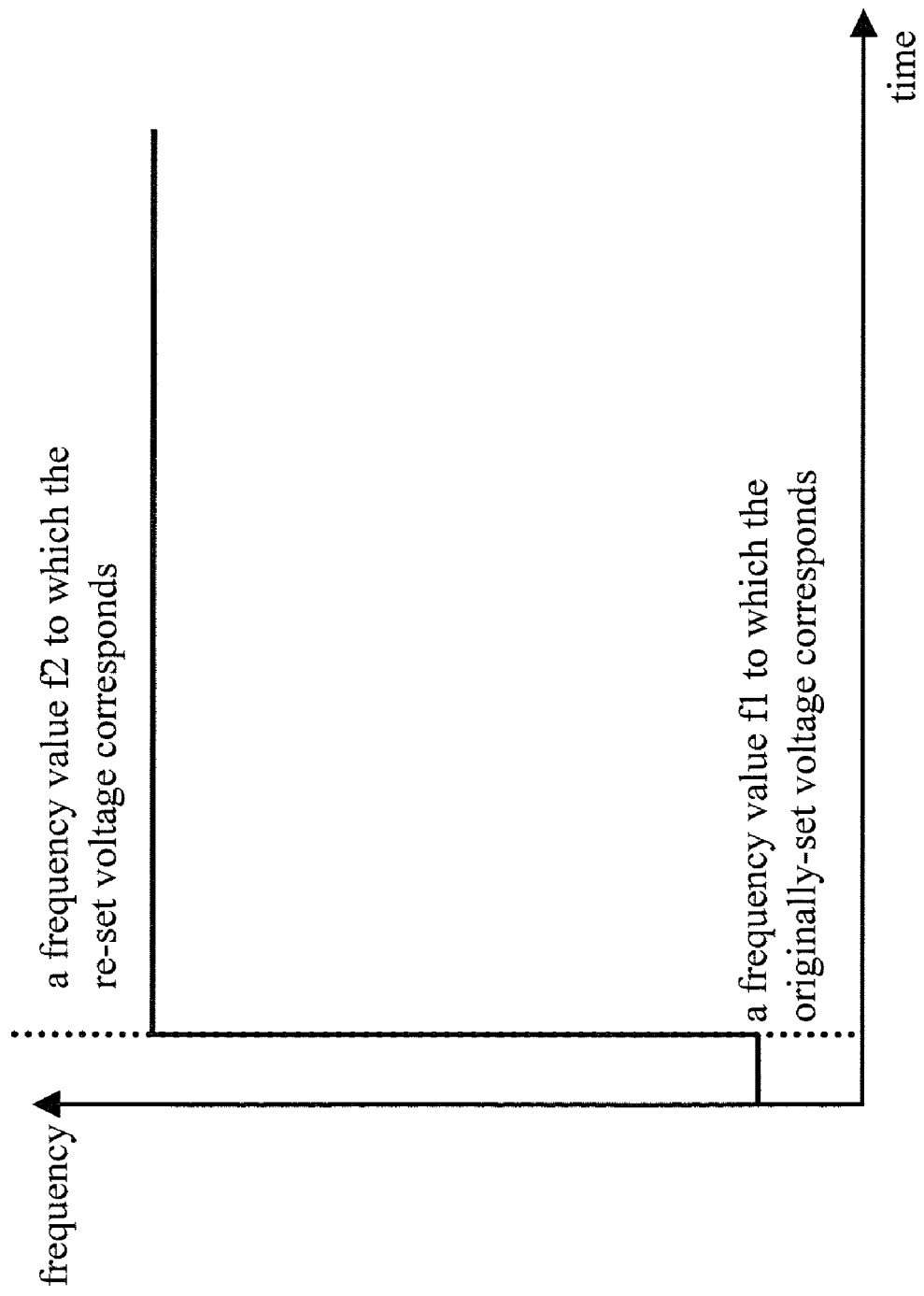
FIG. 6 is a diagram of frequency to period of the reference signal.

Please refer to FIG. 6, which is a corresponding diagram of frequency to period of a reference signal. Similar to FIG. 5, the originally set voltage enters into the re-set voltage directly, that is, the frequency is directly set from $f_1$ to $f_2$.

The lock-in actuator circuit 360 as shown in FIG. 3, is used to perform a temporal feature measurement according to the reference signal $F_r$. A desired frequency or phase is calculated according to the result of the temporal feature measurement. Since the purpose of the temporal feature measurement is only to obtain temporal features of the reference signal $F_r$, length of the captured reference signal need not be limited in the process of sampling. Whether shorter than, equal to, or longer than one period, a signal length capable of providing adequate feature meanings may substantially be considered as a reference for the capturing length. Furthermore, changes can be made according to different accuracy requirements, such that the desired value of the lock-in frequency may be obtained to enter into the lock-in state rapidly.

In addition to the above mentioned calculating mechanism, another method for frequency setting is further provided in the PLL 30. When pursuing a specific frequency, if possible upper and lower limits of the frequency have been known, the phase lock output frequency $f_o$ to which the reference voltage signal $V_{VCO/ICO}$ corresponds may be directly set as represented by formula (1).

$$f_o = \frac{1}{2}(f_{max} + f_{min}) \tag{1}$$

In formula (1), $f_o$ represents the set frequency of the phase-locked output signal; $f_{max}$ represents the possible upper limit of the frequency; and $f_{min}$ represents the possible lower limit of the frequency.

Although achieving the lock-in state by using formula (1) will not be as rapid as the ones adopted in the lock-in actuator circuit 360 of the previous embodiments, however, the time used for achieving such a state can be effectively shortened. In the process of setting, a change in respective weightings of $f_{max}$ and $f_{min}$ may also be made according to personal experience, having no need of setting to an average value of $f_{max}$ and $f_{min}$. A specific frequency value between the possible upper limit $f_{max}$ and lower limit $f_{min}$ can be obtained by the circuit designer according to circuit characteristics and personal experience as the set frequency $f_o$ of the desired phase-locked output signal.

Figure 7:
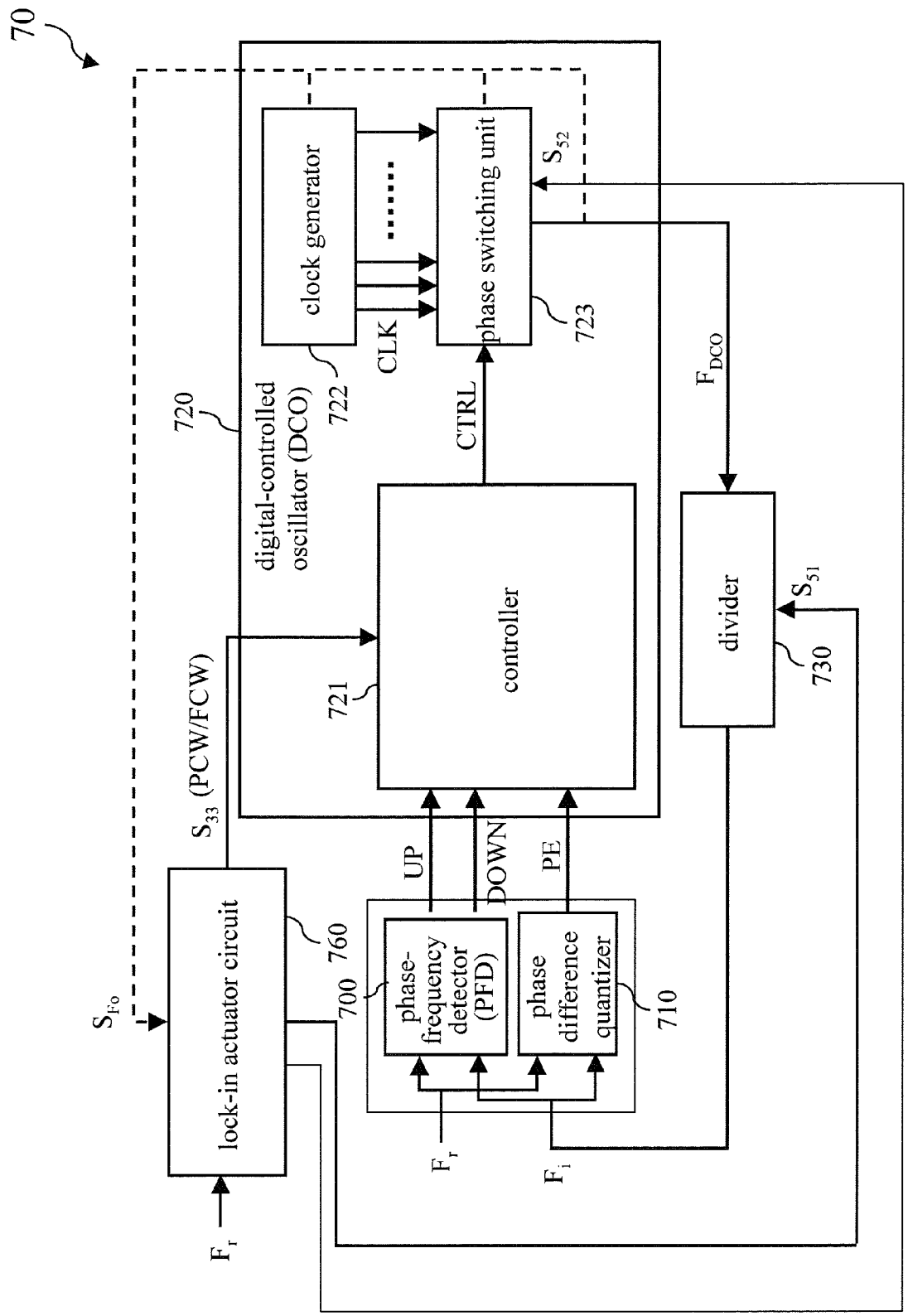

Please refer to FIG. 7, which is an embodiment of a digital PLL for rapid lock-in. As shown in FIG. 7, the digital PLL 70 includes a PFD 700, a phase difference quantizer 710, a DCO 720, a divider 730, and a lock-in actuator circuit 760. The DCO 720 further includes a controller 721, a clock generator 722, and a phase switching unit 723. The digital PLL shown in FIG. 7 is only an embodiment of the invention, alterations like uniting PFD 700 and phase difference quantizer 710 as a single unit or providing only UP and DOWN signals to the DCO 720 should be well known to those skilled in the art, and are thus omitted herein.

The PFD 700 is used to compare the feedback signal $F_i$ with the reference signal $F_r$, and output a level signal according to $F_i$ and $F_r$. The level signal is generally divided into an UP signal and a DOWN signal. The phase difference quantizer 710 is used to output the magnitude of the phase difference as a count signal PE in a manner of digital quantization according to the signal value and time difference of the reference signal $F_r$ and the feedback signal $F_i$. In the present embodiment, both the PFD 700 and the phase difference quantizer 710 are located in the same device, and thereby can receive both the reference signal $F_r$ and the feedback signal $F_i$ (i.e. the phase-locked output signal), and the UP level signal, the DOWN level signal, and the count signal PE may be simultaneously input to the DCO 720. However, in another embodiment, the count signal PE can be derived from corresponding UP and DOWN signals, the phase difference quantizer 710 is thus neglected in such circumstances.

Different from the analog PLL which uses the VCO/ICO, the digital PLL adopts the DCO 720 to process digital signals. In the DCO 720, the UP level signal, the DOWN level signal, and the count signal PE are processed in a controller 721. The controller 721 can be a proportional-integral (PI) controller or a proportional-integral-differential (PID) controller. The controller 721 receives a lock-in signal $S_{33}$ generated from the lock-in actuator circuit 760 to adjust the input UP signal, DOWN signal, and count signal PE, and convert them into an output signal CTRL to be provided to the phase switching unit 723, which then outputs the phase-locked output signal $F_{DCO}$ according to the output signal CTRL. Similar to the analog PLL, if there is a need of dividing the frequency, the frequency of the phase-locked output signal $F_{DCO}$ may be divided by the divider 730, and then the phase difference between the feedback signal $F_i$ (the frequency divided phase-locked output signal) and the reference signal $F_r$ is detected by the PFD 700. A clock generator 722 may exist in the DCO 720 to provide a clock signal CLK for the operation of the phase switching unit 723. The phase-locked output signal $F_{DCO}$ output from the phase switching unit 723, the parameters of the phase switching unit 723, and the parameters of the clock generator 722 may all be fed back to the lock-in actuator circuit 760, which can be referred to as $S_{Fo}$, which is used as a reference for setting the lock-in signal.

The function of the lock-in actuator circuit 760 here is similar to that of the aforementioned analog PLL, while the function of lock-in actuator circuit 760 of the digital PLL is to provide the lock-in signal $S_{33}$ to the controller 721 in the DCO 720 such that the DCO 720 may rapidly find out the required phase-locked output signal, wherein the lock-in signal $S_{33}$ can be a period control word (PCW) or a frequency control word (FCW). The PCW or FCW may be influenced by the parameters fed back from the clock generator 722 and the phase switching unit 723, and the lock-in actuator circuit 760 then makes an optimum modification to perform an automatic aligning to the system, thereby, a digital lock-in state can be achieved without having to experience many oscillation periods. The lock-in actuator circuit 760 can also provide signals $S_{51}$ and $S_{52}$ respectively to the divider 730 and the phase switching unit 723, for achieving the purpose of rapid lock-in.

The divider 730 will be built only when there is a need of dividing the frequency, and when a one-multiple relationship exists between frequencies of the phase-locked output signal $F_o$ and the reference signal $F_r$, the divider 730 is substantially unnecessary.

Figure 8:
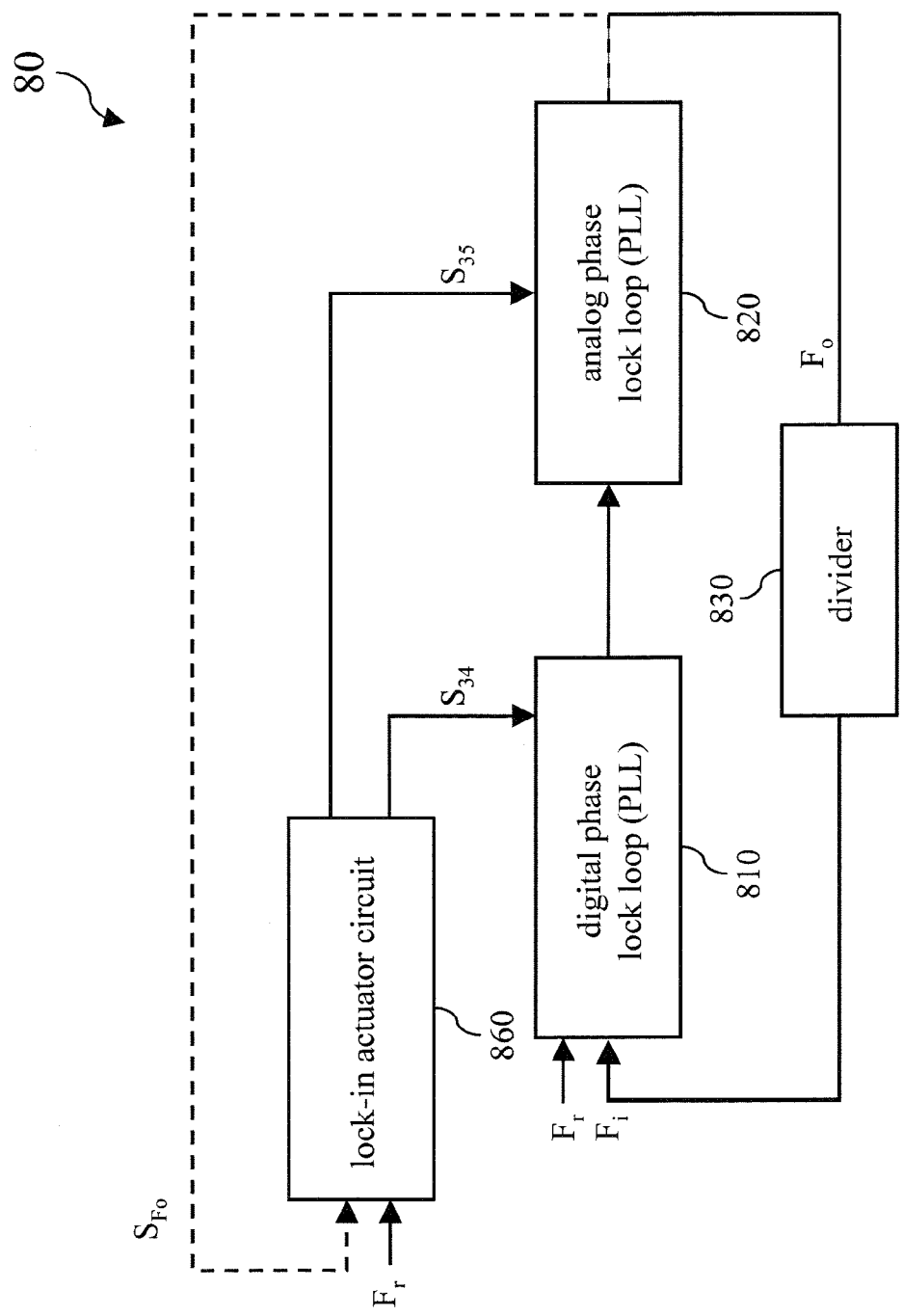

Please refer to FIG. 8, which is an embodiment of a rapid lock-in hybrid digital-analog PLL. As shown in FIG. 8, besides a lock-in actuator circuit 860, the rapid hybrid digital-analog PLL 80 further includes a digital PLL 810, an analog PLL 820, and a divider 830. The digital PLL 810, analog PLL 820, and divider 830 being similar to those in conventional PLLs. A series-connected sequence of the digital PLL 810 and the analog PLL 820 is not necessarily as shown in FIG. 8, and can also be changed to that the analog PLL 820 is in front of the digital PLL 810. The lock-in function and method of the lock-in actuator circuit 860 are the same as those of the lock-in actuator circuits 360, 760 referred to in the above-mentioned embodiments of the digital PLL and analog PLL. The lock-in signals $S_{34}$, $S_{35}$ generated by the lock-in actuator circuit 860 of the present embodiment are respectively used to set the digital PLL 810 and the analog PLL 820 such that a desired lock-in state can be achieved rapidly. The desired lock-in effect can be achieved by selecting both or either one of the lock-in signals $S_{34}$, $S_{35}$.

Similarly in some cases, when a multiple frequency relationship exists between frequencies of the phase-locked output signal $F_o$ and the reference signal $F_r$, the phase-locked output signal $F_o$ may be fed back after its frequency is divided by the divider 830, while when a one-multiple relationship exists between frequencies of the phase-locked output signal $F_o$ and the reference signal $F_r$, such a divider 830 is a redundant element which may be omitted.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A digital PLL, comprising:
   a phase frequency detector (PFD), for receiving a reference signal and a feedback signal, and generating a level signal according to the reference signal and the feedback signal;
   a digital-controlled oscillator (DCO), coupled to the PFD, for generating a phase-locked output signal according to a lock-in signal or/and the level signal; and
   a lock-in actuator circuit, for activating the lock-in signal, wherein the lock-in signal is used to set the digital PLL in a lock-in state;
   wherein the DCO comprises:
   a controller, for generating a phase control signal according to the lock-in signal or/and the level signal; and
   a phase switching unit, for receiving the phase control signal and generating the phase-locked output signal.

2. The digital PLL as claimed in claim 1, wherein the lock-in signal is generated according to the reference signal and/or the phase-locked output signal.

3. The digital PLL as claimed in claim 1, wherein the level signal is generated according to the magnitude of phase difference of the reference signal and the feedback signal.

4. The digital PLL as claimed in claim 1, wherein the lock-in signal is generated by interpolation or extrapolation according to a plurality of voltage values provided by the reference signal and a plurality of corresponding frequency values provided by the phase-locked output signal.

5. The digital PLL as claimed in claim 1, wherein the lock-in signal is generated by look-up tables and/or pre-calculations of provided parameters.

6. The digital PLL as claimed in claim 1, further comprising:
   a phase difference quantizer, for receiving the reference signal and the feedback signal, and generating a count signal according to the reference signal and the feedback signal.

7. The digital PLL as claimed in claim 1, further comprising:
   a divider, coupled to the DCO and the PFD, for dividing the phase-locked output signal, wherein the divided phase-locked output signal is the feedback signal.

8. The digital PLL as claimed in claim 1, wherein the lock-in signal includes at least a frequency control word (FCW) or/and a period control word (PCW).

9. The digital PLL as claimed in claim 1, wherein the lock-in state is set from an initial state or from a first lock-in state.

10. A digital PLL, comprising:
    a phase frequency detector (PFD), for receiving a reference signal and a feedback signal, and generating a level signal according to the reference signal and the feedback signal;
    a digital-controlled oscillator (DCO), coupled to the PFD, for generating a phase-locked output signal according to a lock-in signal or/and the level signal;
    a lock-in actuator circuit, for activating the lock-in signal, wherein the lock-in signal is used to set the digital PLL in a lock-in state; and
    a divider, coupled to the DCO and the PFD, for dividing the phase-locked output signal, wherein the divided phase-locked output signal is the feedback signal, wherein the lock-in actuator circuit controls the dividing of the phase-locked output signal.

11. A method applicable to a PLL for rapid lock-in, comprising:
    measuring a temporal feature of a reference signal or/and a phase-locked output signal;
    providing a lock-in signal according to the temporal feature, wherein the lock-in signal is used to set the PLL in a lock-in states;
    generating a phase control signal according to the lock-in signal; and receiving the phase control signal and generating the phase-locked output signal.

12. The method for rapid lock-in as claimed in claim 11, wherein the lock-in signal is generated by interpolation or extrapolation according to a plurality of voltage values and a plurality of corresponding frequency values provided by the temporal feature.

13. The method for rapid lock-in as claimed in claim 11, wherein the temporal feature provides a upper frequency limit and a lower frequency limit of the frequency when the PLL is in a lock-in state.

14. The method for rapid lock-in as claimed in claim 13, wherein the initial lock-in frequency is the average value of the upper frequency limit and the lower frequency limit respectively weighted.

15. The method for rapid lock-in as claimed in claim 11, wherein the lock-in signal is generated by look-up tables and/or pre-calculations of provided parameters.

16. The method for rapid lock-in as claimed in claim 11, wherein the lock-in state is set from an initial state or from a first lock-in state.

* * * * *